United States Patent
Sogard (10) Patent No.: US 6,402,380 B1
(45) Date of Patent: *Jun. 11, 2002

(54) FLUID BEARING OPERABLE IN A VACUUM REGION

(75) Inventor: Michael R. Sogard, Menlo Park, CA (US)

(73) Assignee: Nikon Corporation, Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 09/715,265

(22) Filed: Nov. 20, 2000

Related U.S. Application Data (63) Continuation-in-part of application No. 09/444,549, filed on Nov. 22, 1999, now Pat. No. 6,287,004.

(51) Int. Cl.[7] ............... F16C 32/06; F16C 33/00; F16J 15/40
(52) U.S. Cl. ............... 384/12; 384/15; 384/119; 384/130; 277/431; 277/572
(58) Field of Search ............... 384/12, 15, 100, 384/114, 119, 130; 277/431, 351, 551, 549, 572

(56) References Cited

U.S. PATENT DOCUMENTS

| | | |
|---|---|---|
| 3,355,990 A | 12/1967 | Thum |
| 3,610,365 A | 10/1971 | Maddox |
| 4,191,385 A | 3/1980 | Fox et al. |
| 4,425,508 A | 1/1984 | Lewis, Jr. et al. |
| 5,106,204 A | 4/1992 | Dunham |
| 5,218,896 A | 6/1993 | Furukawa |
| 5,760,564 A | 6/1998 | Novak |
| 6,126,169 A | 10/2000 | Sogard et al. |

FOREIGN PATENT DOCUMENTS

| | | |
|---|---|---|
| EP | 0936368 | 8/1999 |

*Primary Examiner*—David A. Bucci
*Assistant Examiner*—William C Joyce
(74) *Attorney, Agent, or Firm*—Finnegan Henderson Farabow Garrett & Dunner, L.L.P.

(57) ABSTRACT

A fluid bearing suitable for use in vacuum region comprises a fluid passageway for introducing a fluid into the bearing, a pump-out slot for evacuating the fluid from the bearing, and a bearing seal disposed along a periphery of the bearing to restrict fluid from escaping from the bearing into the vacuum region. The bearing seal comprises a bridge structure including a first base, a second base, a transverse member fixed at one end to the first base and movably disposed in a slot defined by the second base, and a sealing sheet extending from the transverse member between the first and second bases. The sealing sheet forms a compliant mechanical wall around the periphery of the bearing. The seal further includes an adjustable spring force element which exerts a force on the sealing sheet to ensure marginal contact with a bearing support surface to form a low-frictional seal. The sealing sheet confines the fluid which escapes outside of the pump-out slots to within the perimeter of the wall formed by the sealing sheet. The seal allows for movement of the air bearing relative to the bearing support surface and is suitable for use with an XY wafer or reticle stage. The air bearing and its seal may be adapted as a journal shaft-type bearing.

16 Claims, 8 Drawing Sheets

FLUID BEARING OPERABLE IN A VACUUM REGION

REFERENCE TO RELATED APPLICATIONS

This application is a continuation-in-part of U.S. application Ser. No. 09/444,549 filed Nov. 22, 1999 now U.S. Pat. No. 6,287,004.

FIELD OF THE INVENTION

This invention relates generally to stage devices for precision movement and location, such as used in lithography systems, and more particularly, to a fluid bearing with seal operable within a vacuum system.

BACKGROUND OF THE INVENTION

The precise positioning of an object is required in many applications, including lithography processing in semiconductor manufacturing for forming integrated circuits on semiconductor wafers. As the circuit density of integrated circuits increases and feature size decreases, the accuracy in the methods for laying down the circuits on the semiconductor wafer must improve. Various systems and methods have been developed to attempt to improve positioning and movement of a semiconductor wafer in the lithography process. One way to increase the accuracy is to reduce system complexity and size of the stage device, thus providing greater stability of motion during positioning of the wafer.

Air bearing systems are often used to provide smooth and accurate movement between a stage and another planar surface or a guide structure. An example of a stage device for use in semiconductor processing equipment is disclosed in U.S. Pat. No. 5,760,564. The stage assembly includes two guide rails, one movable in the X direction and the other movable in the Y direction. A plurality of air bearings are attached to the guide rails and stage for movement of the guide rails and stage relative to the base. Since the bearings are attached to the stage and travel with the stage, the base must be at least as large as the diameter of the bearing plus the entire stroke (travel) of the stage. This results in a large base and stage.

Examples of air bearing systems include differentially pumped air bearing systems such as those disclosed in U.S. Pat. No. 4,191,385 to Fox and U.S. Pat. No. 4,425,508 to Lewis et al. Lewis et al. disclose an air bearing intended for use in a vacuum chamber, such as in an electron beam lithography system. The air bearing includes an air bearing plate defining a plurality of H-shaped grooves around its outer periphery and a metering valve disposed in each H-groove for introducing pressurized air into each H-groove. The pressurized air provides an air cushion between the face of the air bearing plate and the opposing face of a moving plate. The air bearing plate also includes a central vacuum region circumscribed by two concentric pump-out slots. The pressure in the vacuum region is maintained by conventional vacuum pumps. The two concentric pump-out slots are radially inward of the H-grooves to scavenge the air escaping inwardly from the H-grooves in order to prevent the air from reaching the vacuum region. Thus, the pump-out slots separate the air bearing from the central vacuum region.

Air from the air bearing flows through the small gap between the air bearing plate and the opposing face of the moving plate. Small values for the gap are required in an attempt to reduce air flow to the vacuum region. However, the smaller the gap, the tighter the necessary mechanical tolerance on the air bearing plate and the opposing surface of the moving plate, substantially increasing the manufacturing costs. A typical air bearing gap is approximately 5 microns, requiring precision machining over a relatively large surface area to substantially increase manufacturing costs, particularly because two such large precision machined surfaces are needed. In addition, because the stiffness of the air bearing is a function of this gap, adjusting the gap purely to control the air flow is often impractical.

Thus, it is desirable to provide an air bearing which is effective in preventing gas leakage into the vacuum environment and which is suitable for use within a vacuum environment and not just surrounding a vacuum. It is further desirable to provide such an air bearing which is cost effective, simple to manufacture, robust, and which produce very little wear or vibration during operation.

SUMMARY OF THE INVENTION

The air or other fluid bearing of the present invention suitable for use in a vacuum region comprises a bearing structure defining pump-out slots or passageways circumscribing a central fluid bearing outlet. One or more bearing seals are disposed along a periphery of the bearing to form a sealing wall. The sealing wall confines the fluid which escaped outside of the pump-out slots to within the perimeter of the wall formed by the sealing sheet and prevent the escape of fluid into the surrounding vacuum region. The bearing seal comprises a bridge structure including a first base, a second base, a transverse member fixed at one end to the first base and movably disposed in a slot defined by the second base, and a sealing sheet extending from the transverse member between the first and second bases.

The sealing sheets may but need not contact the opposing bearing surface. Even if there is a gap between the adjacent sealing sheets and between the sealing sheets and the opposing bearing surface, the sealing sheet structure serves to prevent nearly all of the gas molecules from escaping into the surrounding vacuum region and the gas molecules are eventually evacuated through one of the pump-out slots. The sealing wall structure may be fabricated using semiconductor type processing technology from, for example, silicon or thin metal films to providing a light flexible structure.

The seal further includes an adjustable spring force element, such as a spring, a constant force spring, or a flexural coupling, which exerts a force on the sealing sheet to ensure marginal contact with a bearing support surface to form a low-frictional seal.

The sealing sheet wall of the inventive bearing exerts a relatively low frictional force on a surface of a stage movable relative to the bearing so as to not impede the motion of the stage. The low frictional force is a result of both the relatively low mass of sealing sheet and the gap, if any, between the sealing sheets and the opposing bearing surface. Thus, the bearing of the present invention provides fast and precise movement and positioning while maintaining the vacuum surrounding the air bearing. In addition, a plurality of individual air bearings of the present invention may be utilized within a vacuum region.

The air pressure at the outer pump-out slots is preferably sufficiently low such that the air is in the molecular regime in that the molecular mean free path is much greater than mechanical system dimensions. Accordingly, the sealing sheets may be very light as the forces exerted by the impinging gas molecules against the sealing sheet structure are negligible.

The seal allows for movement of the air bearing relative to the bearing support surface and is suitable for use with an XY wafer or reticle stage. The air bearing and its seal may be adapted as a journal shaft-type bearing.

The bearing of the present invention is most appropriately applicable to gas bearings. The bearing of the present invention can be advantageously applied to fluid bearings if the bearing is designed to provide successful scavenging of the fluid, similar to the gas bearing described above. In a fluid bearing, some fluid vapor will typically remain and its pressure is generally related to the vapor pressure of the fluid. Vapor pump-out slots may be provided to reduce the vapor pressure within the air bearing and the sealing sheet structure can reduce the vapor pressure in the vacuum system to a tolerable level.

The above is a brief description of some deficiencies in the prior art and advantages of the present invention. Other features, advantages, and embodiments of the invention will be apparent to those skilled in the art from the following description, drawings, and claims. Corresponding reference characters in the drawings indicate corresponding parts throughout the several views of the drawings.

DESCRIPTION OF THE INVENTION

The present invention comprises a bearing suitable for use in a vacuum environment such as to support a stage which holds a semiconductor wafer being scanned by an electron beam lithography machine or other lithography systems. The following description is presented to enable any person skilled in the art to make and use the invention. Descriptions of specific applications are provided only as examples. Various modifications to the preferred embodiment will be readily apparent to those skilled in the art, and the general principles defined herein may be applied to other embodiments and applications without departing from the spirit and scope of the invention. Thus, the present invention is not intended to be limited to the embodiments shown, but is to be accorded the widest scope consistent with the principles and features described herein. Copending U.S. application Ser. No. 09/012,432, filed on Jan. 23, 1998, entitled "Air Bearing Operable in a Vacuum Region" by Michael R. Sogard and Dennis Spicer, discloses the design of an air bearing operable under vacuum conditions for use with an X-Y stage used in a vacuum chamber, for example. The entirety of U.S. application Ser. No. 09/012,432 is incorporated herein by reference thereto.

Although the fluid bearing of the present invention is generally described below as an air bearing, it is to be understood that the bearing of the present invention can be adapted for use as a fluid bearing.

Figure 1:
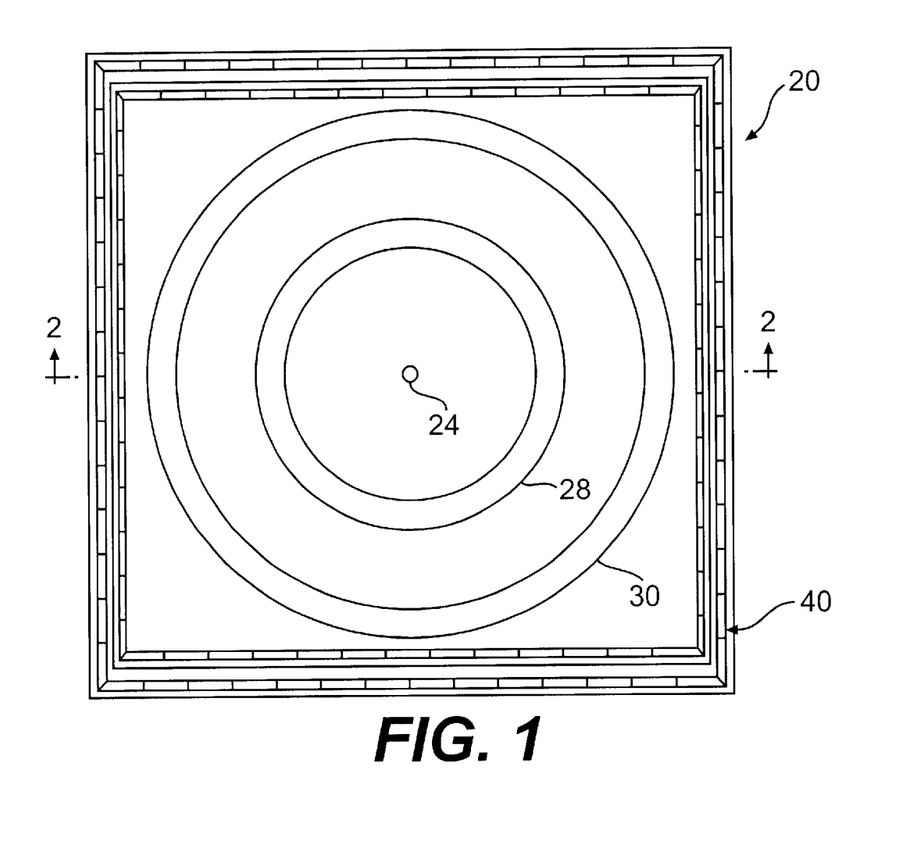
FIG. 1 is a bottom plane view of a fluid bearing system of the present invention.
Figure 2:
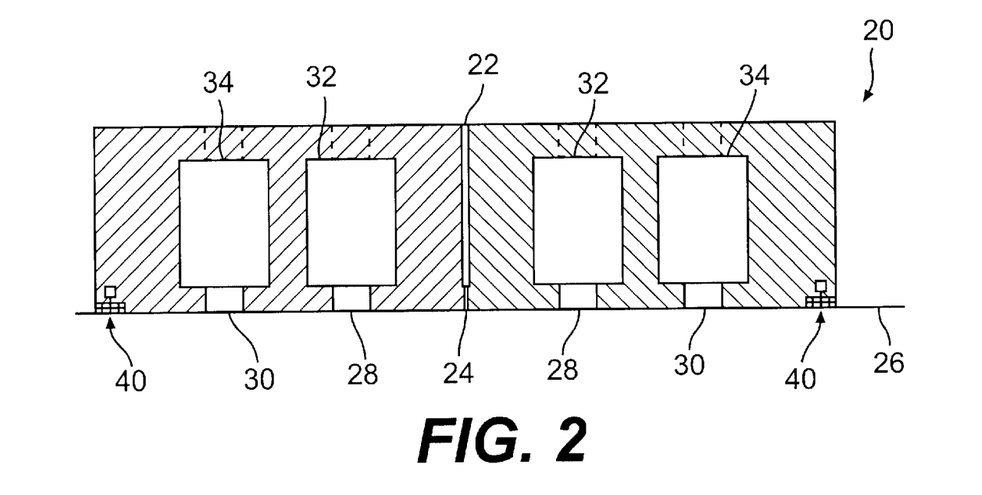
FIG. 2 is a cross-sectional view of the fluid bearing system of FIG. 1 along line 2—2.

FIG. 1 is a bottom plane view of a fluid bearing 20 of the present invention and FIG. 2 is a cross-sectional view of the bearing 20 along line 2—2 of FIG. 1. The bearing 20 generally comprises a structure defining a passage 22 terminating in a small orifice 24 which opposes a surface of the substrate 26 interfacing with the bearing 20. The bearing 20 may support an XY stage (not shown) on its top surface, for example. The air bearing 20 is preferably movable in a plane over the planar opposing surface of the substrate 26.

A small gap (not shown) is maintained between the opposing surfaces of the bearing 20 and the substrate 26. The gap is preferably approximately 5–10 μm. Pressurized air or other suitable fluid is introduced from a conventional source into the air bearing 20 via passage 22. The fluid exits through orifice 24 and is radially distributed through the gap between the bearing 20 and the substrate 26. A plurality of passages and/or orifices may be provided. Alternative ways of introducing fluid to the bearing may be provided. For example, the bearing 20 may provide slots in a porous region through which fluid may diffuse.

The bearing 20 further defines two circular pump-out slots 28, 30 concentric with orifice 24 for evacuating the fluid from the bearing 20. The pump-out slots 28, 30 are in fluid communication with portions 32, 34, respectively, of a pump-out manifold. Alternatively, the bearing 20 may provide one or more than two pump-out slots. Preferably, differential vacuum pressures are applied to manifold portions 32, 34. In particular, a higher vacuum is applied at the outer pump-out slot 30 than at the inner pump-out slot 28. Further, in the case of an air bearing, because the input air to the bearing 20 is typically supplied at a pressure higher than 1 atmosphere, bearing 20 may provide a separate slot (not shown) radially inward of the pump-out slots 28, 30 to allow the air to escape to the ambient air surrounding the vacuum system. The provision of such a separate pump-out slot in fluid communication with the ambient surrounding the vacuum system facilitates in reducing the pumping requirements for the pump-out slots 28, 30. Additionally, the fluid pressure distribution within the bearing is identical to that of the bearing operating under normal atmospheric conditions. Thus, performance of the bearing can be predicted based on that of similar conventional bearings.

Preferably, the levels of vacuum applied by the pump-outs are such that the fluid immediately radially outside the outer pump-out slot 30 between the bearing 20 and substrate 26 is in molecular regime such that the localized fluid pressure is very low. However, the fluid pressure at this point may nonetheless be higher than the pressure in the vacuum environment exterior of the bearing 20. Thus, it is desirable to further prevent or minimize the gas from escaping into the surrounding vacuum region. Thus, bearing 20 further comprises one or more bearing seals 40 disposed around, for example, a perimeter of the bearing 20.

Figure 2A:
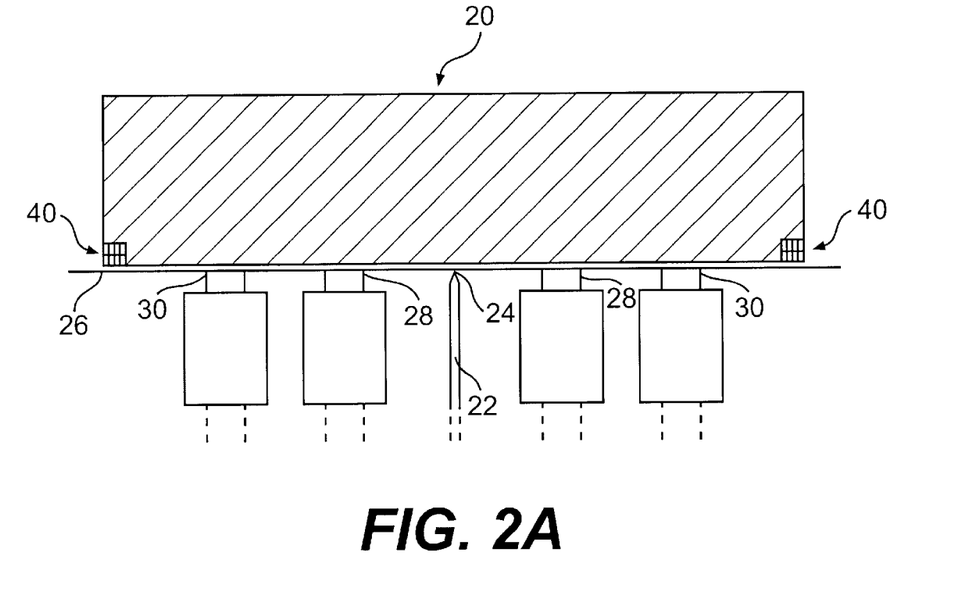
FIG. 2A is a cross-sectional view of an alternative embodiment of the fluid bearing system of FIG. 2.

FIG. 2A is a cross-sectional view of an alternative embodiment of the bearing 20 of FIG. 2. In this embodiment, the passage 22 terminates in a small orifice 24 which opposes a surface of the bearing 20 interfacing with the substrate 26. The bearing 20 may support an XY stage (not shown) on its top surface, for example. The air bearing 20 is preferably movable in a plane over the planar opposing surface of the substrate 26.

A small gap is maintained between the opposing surfaces of the bearing 20 and the substrate 26. The gap is preferably approximately 5–10 μm. Pressurized air or other suitable fluid is introduced from a conventional source via passage 22. The fluid exits through orifice 24 and is radially distributed through the gap between the bearing 20 and the substrate 26. A plurality of passages and/or orifices may be provided. Alternative ways of introducing fluid may be provided.

This embodiment further defines two circular pump-out slots 28, 30 concentric with orifice 24 for evacuating the fluid. The pump-out slots 28, 30 are in fluid communication with portions 32, 34, respectively, of a pump-out manifold. Preferably, differential vacuum pressures are applied to manifold portions 32, 34. In particular, a higher vacuum is applied at the outer pump-out slot 30 than at the inner pump-out slot 28.

Preferably, the levels of vacuum applied by the pump-outs are such that the fluid immediately radially outside the outer pump-out slot 30 between the bearing 20 and substrate 26 is in molecular regime such that the localized fluid pressure is very low. However, the fluid pressure at this point may nonetheless be higher than the pressure in the vacuum environment exterior of the bearing 20. Thus, it is desirable to further prevent or minimize the gas from escaping into the surrounding vacuum region. Thus, bearing 20 further comprises one or more bearing seals 40 disposed around, for example, a perimeter of the bearing 20.

Figure 3:
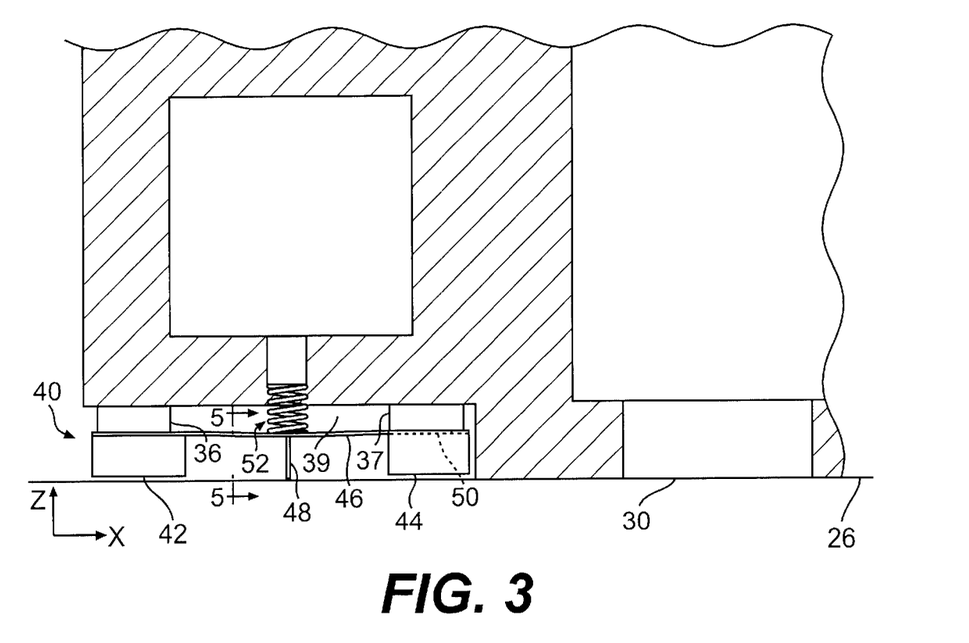
FIGS. 3 and 4 each shows an enlarged partial cross-sectional view of the fluid bearing of FIGS. 1 and 2 illustrating the bearing seal in greater detail.
Figure 4:
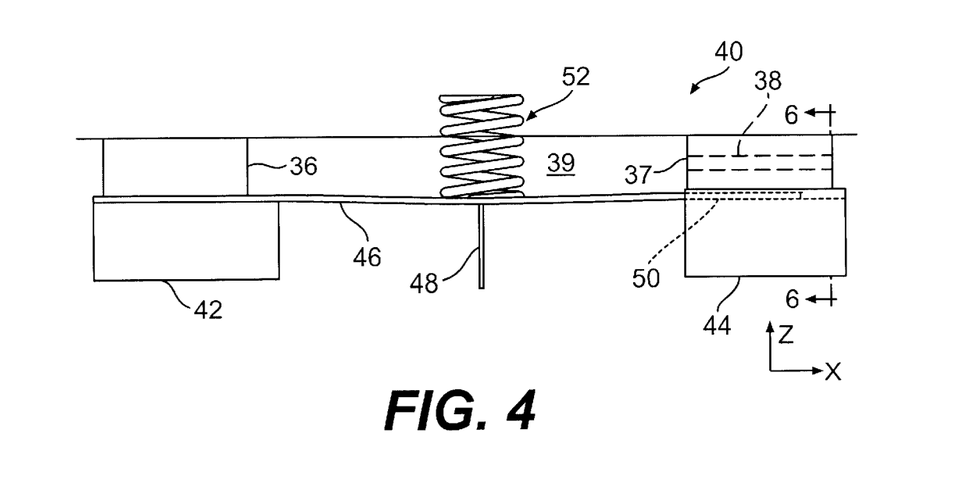
Figure 5:
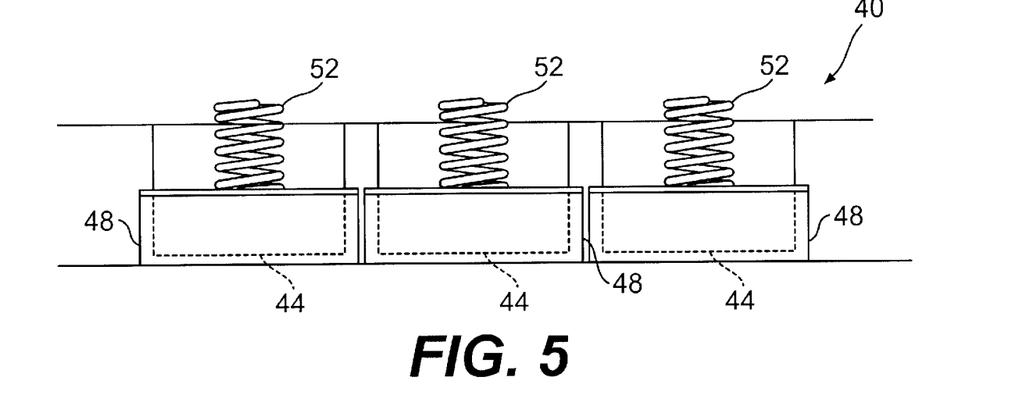
FIG. 5 is a partial side cross-sectional view of the fluid bearing system along line 5—5 of FIG. 3.

The bearing seals 40 are shown in more details in FIGS. 3–6. FIGS. 3 and 4 each shows an enlarged partial cross-sectional view of the bearing 20. FIG. 5 is a partial side cross-sectional view of the bearing system along line 5—5 of FIG. 3. Although the bearing seals 40 are shown in FIG. 1 to be disposed at the periphery of the bearing 20, the bearing seals 40 may be disposed in any suitable configuration within the periphery of the bearing 20 and radially outward of the outer pump-out slot 30.

Each bearing seal 40 generally comprises a bridge structure extending from supports 36, 37. The bridge structure includes a first base 42, a second base 44, a transverse member 46 coupled to the first base 42 and slideable within the second base 44, and a sealing sheet 48 extending from the transverse member 46. The transverse member 46 extends between the first and second bases 42, 44 and is fixed at one end to the first base 42 and movably disposed in a slot 50 defined by the second base 44, as will be described in more detail below. The transverse member 46 may be affixed to the first base 42 by any suitable mechanism such as a set screw, adhesive, welding, or may be integrally formed. The mechanism must be vacuum compatible, however. The first and second bases 42, 44 are preferably disposed such that there is a clearance between the bases 42, 44 and the opposing surface of the substrate 26. For example, the clearance may be approximately 0.1–0.5 mm. This clearance avoids the need for the tight mechanical tolerances demanded by the bearing surfaces themselves.

The sealing sheets 48 of the bearing seals 40 together form a wall with small gaps between the adjacent sealing sheets 48 around the periphery of the bearing 20 as shown in FIG. 1. Alternatively although not preferred, the bearing seals 40 may be integrally formed on each side of the bearing 20. For example, in the embodiment shown in FIG. 1, the bearing 20 may comprise four bearing seals 40, one on each of the four sides of the bearing 20. In another alternative embodiment, the bearing seals 40 may be integrally formed such that the sealing sheet forms a single integral wall around the outer pump-out slot 30.

The wall formed by the sealing sheets 48 confines the fluid escaping outside of the pump-out slots 28 and 30 to within the perimeter of the wall. The sealing wall formed by the sealing sheets 48 thus provides a high level of containment of the gas or fluid in the air bearing 20. Because the fluid pressure exterior to the outer pump-out slot 30 may be so low that the fluid may be in the molecular regime, the mean free path of the molecules is larger than the dimensions of the gaps between adjacent sealing sheets 48 and the gaps, if any, between the adjacent sealing sheets 48 and the surface of the substrate 26. Thus, the amount of gas or fluid escaping past the inner and outer pump-out slots 28, 30 and through the gaps of the bearing 20, such as between adjacent sealing sheets 48, would be extremely small.

The bearing seal 40 further comprises an adjustable spring force element 52 which exerts a small force on the transverse member 46 which in turns exerts a small force on the sealing sheet 48. The spring force or the spring constant of the spring force element 52 may be adjusted by any suitable mechanism. The desired spring force of the spring force element 52 may depend on the application and various parameters such as the size of the bearing 20 and the intended gap between the bearing 20 and the opposing bearing surface.

The spring force element 52 may provide a screw or other mechanism for adjusting the tension or spring constant of the spring element 52. The sealing sheet 48 may be in marginal contact with the surface of the substrate 26 to form a low-frictional seal. Preferably, the adjustable spring force element 52 is adjusted to have a weak spring constant such that the frictional force exerted by the sealing sheet 48 on the substrate 26 as the bearing structure 20 moves relative to the substrate 26 is small or negligible. Alternatively, the sealing sheet 48 may not touch the surface of the substrate 26 and the sealing sheet 48 may "bounce" along slight irregularities on the surface of the substrate 26 as the bearing 20 moves relative to the substrate 26.

The spring force element 52 advantageously allows the sealing sheet 48 to move in the axial Z direction of the spring force element 52, for example, due to thermal expansion and/or other axial motions of the sealing sheet 48 while maintaining marginal contact or close proximity between the sealing sheet 48 and the substrate 26. Thus, the bearing seal 40 allows for ease of movement of the bearing 20 relative to the surface of the substrate 26.

The support 37 preferably defines a channel or an opening 38 therethrough. The channel 38 facilitates pressure equilibrium between region 39 and a region between the transverse member 46 and the substrate 26 radially interior of the sealing sheet 48. By providing this pressure equilibrium mechanism, transverse member 46 need not support significant pressure differentials between region 39 and the region between the transverse member 46 and the substrate 26 radially interior of the sealing sheet 48. Alternatively, the support 37 may be a porous member to allow fluid to pass therethrough to achieve the desired pressure equilibrium.

Sealing sheet 48 may be formed of, for example, a thin sheet of silicon or a compound of silicon or metal, mounted on a surface of the transverse member 46. The sealing sheet 48 has an extremely small mass such that very little force is needed to lift the sealing sheet 48 off of the opposing surface of the substrate 26. The small mass of the sealing sheet 48 ensures that wear, particle generation and mechanical vibration when the bearing 20 moves relative to the substrate 26 are minimized. Where the sealing sheet 48 is formed of silicon or a silicon compound, the sealing sheet 48 preferably has a thickness of approximately 50 to 1000 microns.

The first and second bases 42, 44, transverse member 46 and/or the sealing sheet 48 may be integrally formed of, for example, silicon, a silicon compound or metal. Well known semiconductor processing technology may be used to micromachine such structures. The fabrication of the first and second bases 42, 44, transverse member 46 and/or the sealing sheet 48 may be similar to that of cantilever probes used for instance in scanning tunneling microscopy which can be fabricated entirely from silicon or silicon compounds by micromachining. As another alternative, the transverse member 46 and the sealing sheet 48 may be formed by metal film deposition on a micromachined silicon substrate and micromachining the resulting thin metal structure.

Furthermore, the contacting surface or tip of the sealing sheet 48 may be coated with a thin layer of, for example, $Si_3N_4$, such that the surface of the sealing sheet 48 will be much harder than many metals such that wear of the sealing sheet 48 can be negligible.

In one embodiment, the air bearing 20 is approximately 2" by 2". Multiple air bearings 20 of the present invention may be provided to support one or multiple stages. Each air bearing 20 can be individually isolated from the surrounding vacuum region.

Figure 6:
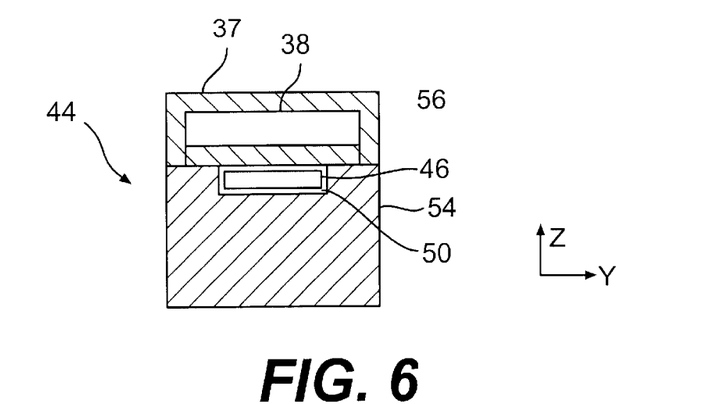
FIG. 6 is a cross-sectional side view along line 6—6 of a base member of the fluid bearing of FIG. 4.

FIG. 6 shows a cross-sectional side view of the second base 44 and support 37 of the bearing 20. The second base 44 generally comprises a body 54 defining the slot 50. As shown in FIG. 6, each slot 50 has cross-sectional dimensions slightly greater than those of the transverse member 46 such that the transverse member 46 can move slightly within the slot 50. Thus, by disposing a free end of each transverse member 46 in the slot 50 of the second base 44, greater torsional strength and rigidity is imparted to the bearing seal 40. If the sealing sheet 48 and transverse member 46 do not have sufficient torsional strength, irregularities on the surface of the substrate 26 may catch a corner of the sealing sheet 48, causing it to twist and possibly buckle and/or break the sealing sheet 48 or transverse member 46 when the bearing 20 moves relative to the opposing surface of the substrate 26 in a direction generally parallel to one or more of the sealing sheets 48.

Because of the geometry of the transverse member 46 and because one end of the transverse member 46 is affixed to the first base 42 while another end is disposed within the slot 50, the transverse member 46 generally cannot move laterally in any significant amount in the Y direction. However, the provision of the slot 50 allows the transverse member 46, along with the sealing sheet 48, to move slightly in the X direction, the direction of the slot 50, as the height in the Z direction of the bearing 20 relative to the substrate 26 varies. In addition, the provision of the slot 50 allows the transverse member 46, along with the sealing sheet 48, to twist about the X direction. The support 37 forming a cover to the slot 50 may prevent the sealing sheet 48 from twisting out of the slot 50. These features advantageously increase the torsional rigidity of the bearing seal 40.

For example, when irregularities on the surface of the substrate 26 catch a corner of the sealing sheet 48 as the bearing 20 is moving in a direction generally parallel to the sealing sheet 48, the slot 50 allows the transverse member 46 to move slightly in the X direction and to twist about the X direction. Such freedom of motion of the transverse member 46 thus imparts torsional rigidity to the sealing sheet 48.

Figure 7:
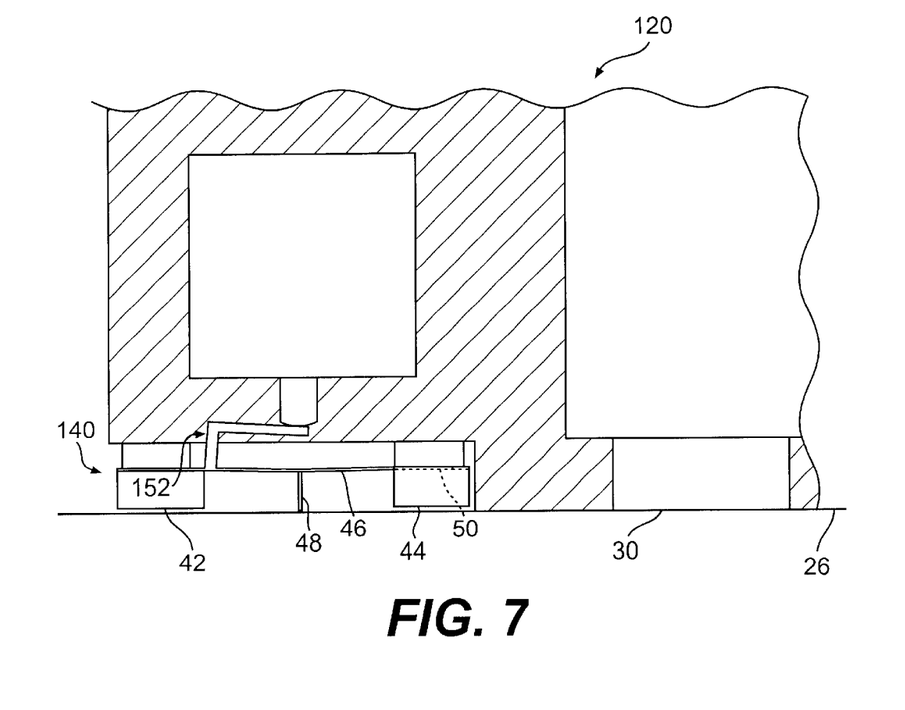
FIG. 7 is a partial side cross-sectional view of an alternative embodiment of the fluid bearing system of the present invention.
Figure 8:
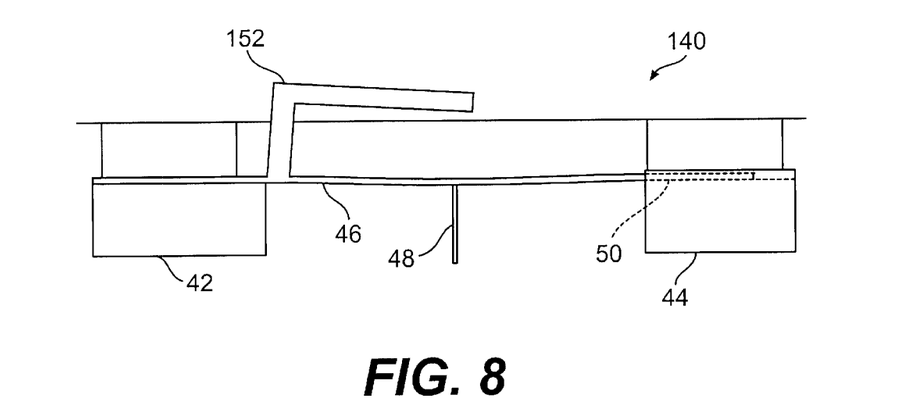
FIG. 8 shows an enlarged partial cross-sectional view of the fluid bearing of FIG. 7 illustrating the fluid bearing seal in greater detail.

FIGS. 7 and 8 are partial side cross-sectional views of an alternative bearing 120. The bearing seal 140 similarly comprises the bridge structure including the first base 42, second base 44 defining a slot 50, transverse member 46 coupled therebetween, and sealing sheet 48. However, in this embodiment, the spring force element is a flexural coupling 152. Similar to the embodiment described above, the spring constant of the flexural coupling 152 may be adjustable such as by providing a screw for adjusting the tension of the flexural coupling 152. Also, the desired spring force of the flexural coupling 152 may depend on the application and various parameters such as the size of the bearing and the intended gap between the bearing and the opposing bearing surface.

Although the fluid bearing of the present invention is described in terms of a fluid bearing for stages and which interfaces with another planar surface, it is to be understood that the fluid bearing of the present invention is also applicable to, for example, a journal shaft-type fluid bearing where a round shaft is rotatable and/or transversely slidable relative to the bearing, or a rectangular shaft is transversely slidable relative to the bearing, for example, as described below. An application of such bearings is also described in M. Ohtsuka, SME International Journal, Series III, Vol. 33, 61 (1990), the entirety of which is incorporated herein by reference.

Figure 9:
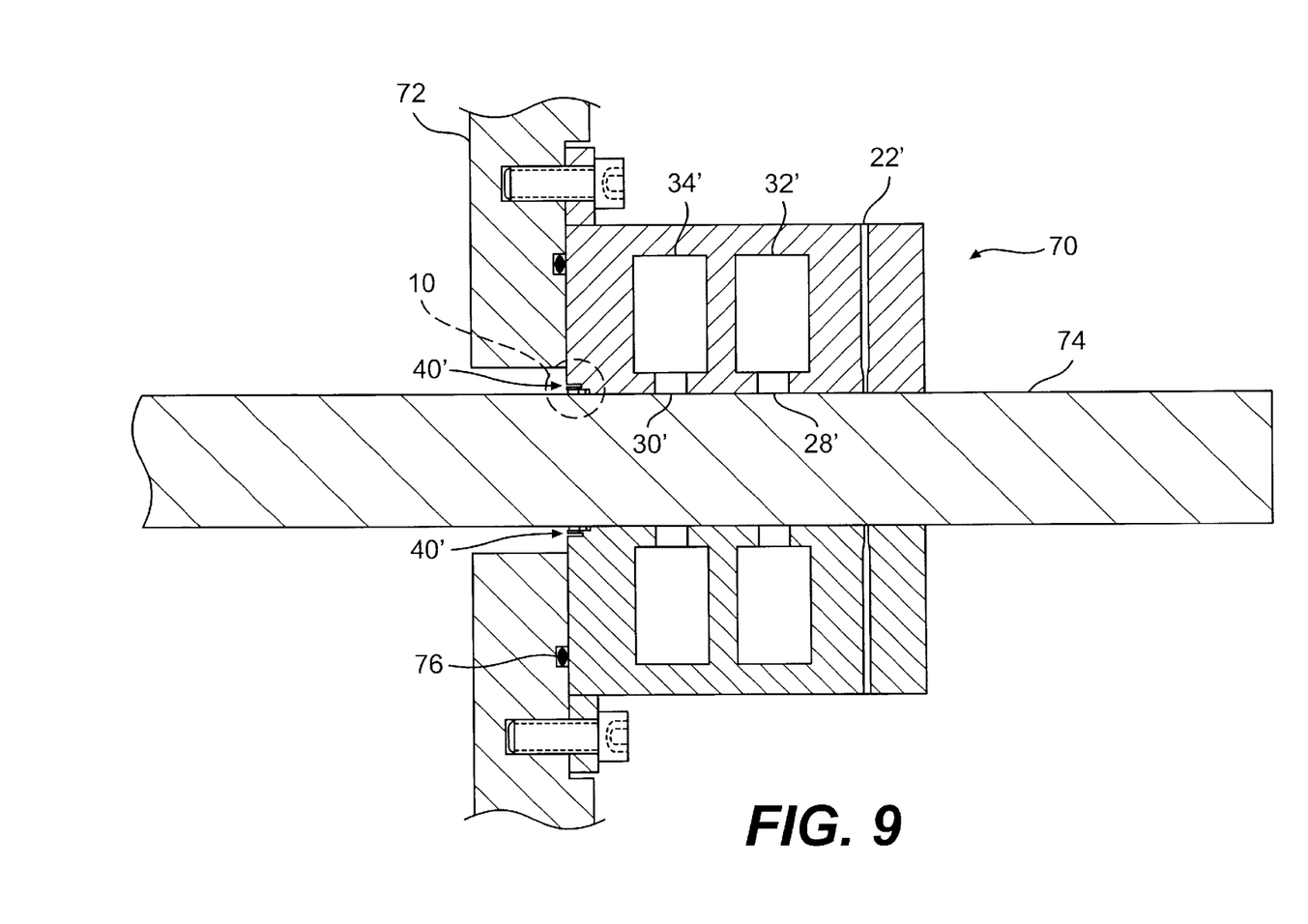
FIG. 9 is a cross-sectional view of a journal shaft-type fluid bearing utilizing a fluid bearing of the present invention adapted for use as a journal type bearing.
Figure 10:
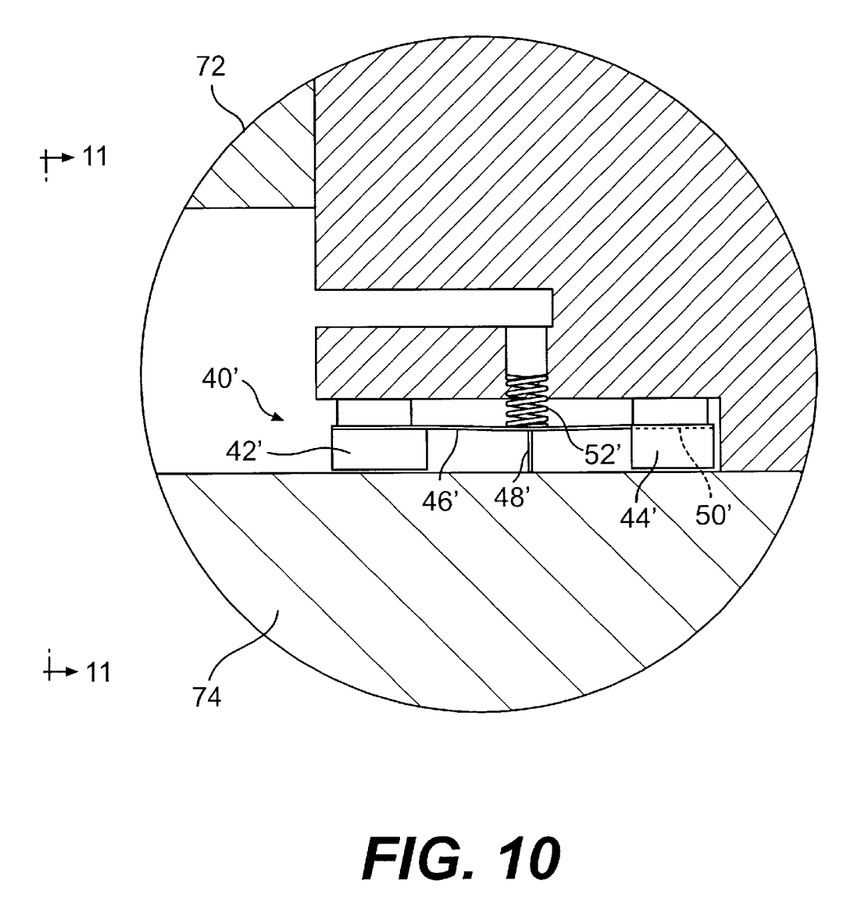
FIG. 10 is an enlarged view of the portion of the portion of FIG. 9 included within the circle 10.
Figure 11:
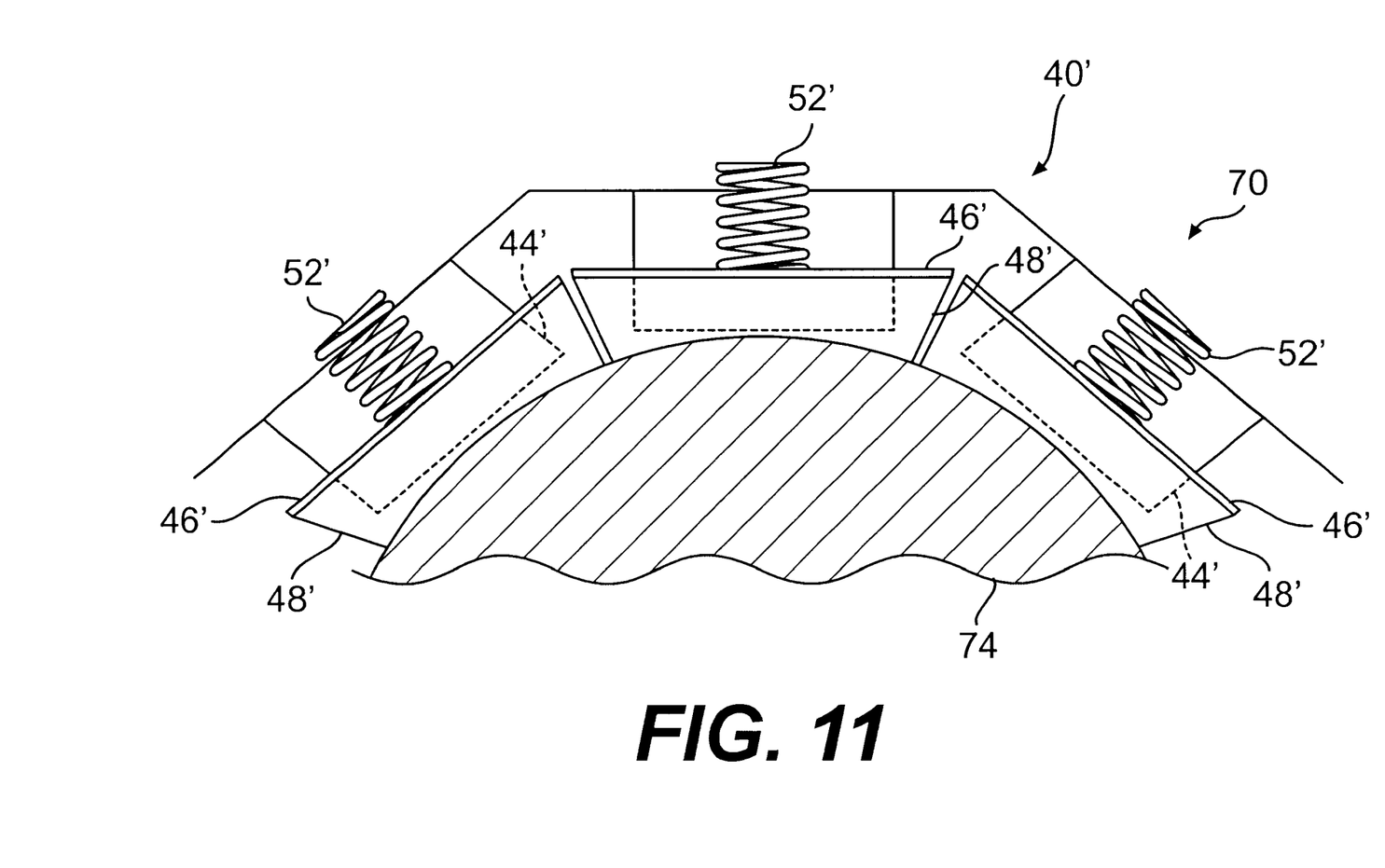
FIG. 11 is a cross-sectional view of the fluid bearing of FIG. 10 across line 11—11.

For example, FIGS. 9, 10 and 11 are cross-sectional views of a journal shaft-type bearing 70 utilizing a bearing of the present invention adapted for use as a journal type bearing. In this embodiment, the journal shaft-type bearing 70 is attached to an exterior surface of a vacuum vessel wall 72, disposed outside a vacuum region defined by vacuum vessel wall 72 and about a shaft 74. For example, one end of the shaft 74 disposed outside of the vacuum region may be connected to a motor or other actuator to provide axial and/or rotational movement of the shaft and the other end of the shaft 74 disposed within the vacuum region may be connected to a stage or other movable structure. The vacuum region is also isolated from ambient air by the provision of a vacuum O-ring seal 76. The shaft 74 is rotatable and/or slidable relative to and within the concentric journal bearing 70.

Pressurized air or other suitable fluid is introduced from a conventional source into the air bearing 70 via passage 22'. The fluid exits from passage 22' and is radially distributed in the gap between the bearing 70 and the shaft 74. The bearing 70 further defines two pump-out slots 28', 30' concentric with shaft 72 for evacuating the fluid from the bearing 70. The pump-out slots 28', 30' are in fluid communication with portions 32', 34', respectively, of a pump-out manifold. The pump-out slot 30' closer to the vacuum vessel wall 72 may reduce the pressure of the fluid to a molecular flow or near molecular flow regime and a sealing wall formed by one or more bearing seals 40' then reduces the flow into the vacuum chamber to a level where a satisfactory vacuum level can be maintained without exorbitant pumping requirements.

As noted, the journal shaft-type bearing 70 comprises one or more bearing seals 40'. Similar to the previously described embodiments, each bearing seal 40' generally comprises a bridge structure including a first base 42', a second base 44' (FIG. 10) defining a slot 50', a transverse member 46' coupled to the first base and slideable within the slot 50' in the second base 44', and a sealing sheet 48' extending from the transverse member 46'. Each of these components is similar to those described above except that the sealing sheet 48' has a curved edge to conform to the curved surface of the cylindrical shaft 74 and that the transverse members 46' of the bearing 70 are disposed about a circular perimeter of the shaft 74. The bearing seal 40' also comprises an adjustable spring force element 52' which exerts a small force on the transverse member 46' which in turn exerts a small force on the sealing sheet 48'. Where a gap exists in a radial direction between the transverse member 46' in the slot and a cover of the slot, the transverse member 46' and thus the sealing sheet 48' is permitted to twist by a limited amount, thereby allowing the bearing seal 40' to remain in contact with the shaft 74. This is so even if the shaft 74 experiences eccentric motion and moves away from the center of the journal when transverse forces are applied.

The bearing of the present invention provides an effective, reliable and robust yet simple, cost-effective, and space-efficient mechanism to contain fluid within the bearing. For example, the bearing of the present invention allows greater tolerances between opposing surfaces of the bearing and the substrate, substantially decreasing manufacturing costs.

While specific embodiments of the invention have been described and illustrated, it will be appreciated that modifications can be made to these embodiments without departing from the spirit of the invention. Thus, the invention is intended to be defined in terms of the following claims.

What is claimed is:

1. A fluid bearing assembly for bearing on a first surface, the assembly comprising:
   a structure having a bearing surface opposing the first surface, the structure defining:
      a fluid input passage terminating in the bearing surface and capable of directing fluid towards the first surface;
      a fluid output passage terminating in the bearing surface and capable of directing fluid away from the first surface; and
      a seal comprising a transverse member having a free end, a fixed end and a sealing sheet extending from said transverse member between the free and fixed ends toward the first surface, the fluid output passage being disposed between the seal and the fluid input passage.

2. The fluid bearing of claim 1, wherein said bearing structure defines a perimeter, said seal being disposed adjacent said bearing structure perimeter.

3. The fluid bearing of claim 1, wherein the fluid output passage circumscribes the fluid input passage at the bearing surface, and wherein the sealing sheet circumscribes the fluid output passage at the bearing surface.

4. The fluid bearing of claim 1, wherein the sealing sheet comprises silicon, silicon compound, or metal.

5. The fluid bearing of claim 1, wherein said bearing structure comprises a plurality of said seals and said sealing sheets of said plurality of seals are disposed to form a sealing wall about the fluid output passage at the bearing surface.

6. The fluid bearing of claim 5, wherein sealing sheets of said plurality of seals defines gaps therebetween in said sealing wall.

7. The fluid bearing of claim 1, wherein said seal further comprises a first base and a second base defining a slot therein, said transverse member fixed end is attached to said first base and said transverse member free end is disposed in said slot of said second base.

8. The fluid bearing of claim 1, wherein said seal further comprises a spring force element coupled to said transverse member to exert a force on said sealing sheet against the first surface.

9. The fluid bearing of claim 8, wherein said spring force element has an adjustable spring constant.

10. The fluid bearing of claim 8, wherein said spring force element is a flexural coupling.

11. The fluid bearing of claim 1, wherein the first surface and said bearing surface are circular and wherein said sealing sheet has a curved edge to generally conform to a portion of the circular first surface.

12. A method of sealing an interface between a bearing structure and a surface, said method comprising:
   directing a flow of fluid to the surface through an input channel defined in the bearing structure;
   conducting the fluid away from the surface through an output channel defined in the bearing structure and exterior to the input channel on the bearing structure; and
   enclosing the fluid within a region between the surface and the bearing structure by a sealing sheet disposed exterior to the output channel on the bearing structure and extending toward the surface from a transverse member generally congruent with the surface, the sealing sheet extending between a free end and a fixed end of the transverse member.

13. The method of claim 12, further comprising maintaining a pressure differential between said region and another region exterior to said region.

14. The method of claim 12, wherein in the region the fluid is a gas having a pressure such that the gas is in the molecular regime.

15. The method of claim 12, further comprising moving the bearing structure relative to the first surface.

16. A fluid bearing assembly for bearing on a first surface, the assembly comprising:
   a structure having a bearing surface opposing the first surface;
   a fluid input passage terminating in the first surface and capable of directing fluid towards the bearing surface;
   a fluid output passage terminating in the first surface and capable of directing fluid away from the bearing surface; and
   a seal comprising a transverse member having a free end, a fixed end and a sealing sheet extending from said transverse member between the free and fixed ends toward the first surface, the fluid output passage being disposed between the seal and the fluid input passage.

* * * * *